United States Patent
Bosch et al.

(10) Patent No.: US 9,400,312 B2
(45) Date of Patent: Jul. 26, 2016

(54) BATTERY SYSTEM AND METHOD FOR DETERMINING BATTERY MODULE VOLTAGES

(75) Inventors: Andreas Bosch, Oberriexingen (DE); Joachim Fetzer, Bad-Ditzenbach (DE); Stefan Butzmann, Beilstein (DE); Holger Fink, Stuttgart (DE); Martin Lang, Hessigheim (DE)

(73) Assignee: Robert Bosch GmbH, Stuttgart (DE)

( * ) Notice: Subject to any disclaimer, the term of this patent is extended or adjusted under 35 U.S.C. 154(b) by 519 days.

(21) Appl. No.: 13/825,284

(22) PCT Filed: Aug. 12, 2011

(86) PCT No.: PCT/EP2011/063940
§ 371 (c)(1),
(2), (4) Date: Jan. 20, 2014

(87) PCT Pub. No.: WO2012/038152
PCT Pub. Date: Mar. 29, 2012

(65) Prior Publication Data
US 2014/0145685 A1    May 29, 2014

(30) Foreign Application Priority Data
Sep. 20, 2010    (DE) .......... 10 2010 041 049

(51) Int. Cl.
| | |
|---|---|
| *G01R 31/36* | (2006.01) |
| *H01M 10/48* | (2006.01) |
| *H04Q 9/00* | (2006.01) |
| *H02J 7/00* | (2006.01) |
| *H01M 10/052* | (2010.01) |

(52) U.S. Cl.
CPC .......... *G01R 31/362* (2013.01); *G01R 31/3658* (2013.01); *H01M 10/482* (2013.01); *H02J 7/0029* (2013.01); *H04Q 9/00* (2013.01); *H01M 10/052* (2013.01); *H04Q 2209/84* (2013.01); *H04Q 2209/86* (2013.01); *Y02T 10/7011* (2013.01)

(58) Field of Classification Search
CPC ....................................................... G01R 31/362
USPC ......................................................... 320/162
See application file for complete search history.

(56) References Cited

U.S. PATENT DOCUMENTS

| | | |
|---|---|---|
| 5,808,469 A | 9/1998 | Kopera |
| 2011/0196632 A1 | 8/2011 | Shimizu |
| 2011/0213509 A1 * | 9/2011 | Onnerud ............. H01M 2/1077 700/297 |

FOREIGN PATENT DOCUMENTS

| | | |
|---|---|---|
| DE | 698 23 204 T2 | 4/2005 |
| DE | 10 2008 043 921 A1 | 5/2010 |
| JP | 11-176480 A | 7/1999 |

OTHER PUBLICATIONS

International Search Report corresponding to PCT Application No. PCT/EP2011/063940, mailed Nov. 15, 2011 (German and English language document) (5 pages).

*Primary Examiner* — Thuan Do
(74) *Attorney, Agent, or Firm* — Maginot, Moore & Beck LLP

(57) ABSTRACT

A battery system comprises at least two modules which include a plurality of battery cells, with each module being associated with a cell voltage detection unit which is connected to a central controller via a common communication bus. Each module additionally includes a module voltage detection unit which is connected to the central controller and is configured to separately detect the voltage of the associated module.

10 Claims, 5 Drawing Sheets

BATTERY SYSTEM AND METHOD FOR DETERMINING BATTERY MODULE VOLTAGES

This application is a 35 U.S.C. 0371 National Stage Application of PCT/EP2011/063940, filed on Aug. 12, 2011, which claims the benefit of priority to Serial No. DE 10 2010 041 049.7, filed on Sep. 20, 2010 in Germany, the disclosures of which are incorporated herein by reference in their entirety.

The present disclosure relates to a battery system, to a method for determining battery module voltages for the battery system and to a motor vehicle having the battery system.

BACKGROUND

It is becoming apparent that in future there will be increased use of new battery systems for both static applications, for example in the case of wind power installations, and vehicles, for example in hybrid and electric vehicles, said battery systems being subject to very great demands in terms of reliability.

The background to these great demands is that failure of the battery system can result in failure of the overall system. By way of example, failure of the traction battery in an electric vehicle results in a "breakdown". Furthermore, the failure of a battery can result in a safety-related problem. In wind power installations, for example, batteries are used in order to protect the installation against inadmissible operating states in a high wind by virtue of rotor blade adjustment.

The block diagram for a battery system based on the prior art is shown in FIG. 1. A battery system, denoted as a whole by 100, comprises a multiplicity of battery cells 10 which are combined in a plurality of modules 24. Furthermore, a charging and isolator device 12 which comprises an isolator switch 14, a charging switch 16 and a charging resistor 18 is provided. In addition, the battery system 100 may comprise an isolator device 20 having an isolator switch 22.

For safe operation of the battery system 100, it is absolutely necessary for each battery cell 10 to be operated within a permitted operating range (voltage range, temperature range, current limits). If a battery cell 10 is outside these limits, it needs to be removed from the cell complex. When the battery cells 10 are connected in series (as shown in FIG. 1), failure of a single battery cell 10 therefore results in failure of the whole battery system 100.

Particularly in hybrid and electric vehicles, batteries using lithium ion or nickel metal hybrid technology are used which have a large number of electrochemical battery cells connected in series. A battery management unit is used for monitoring the battery and is intended to ensure not only safety monitoring but also the longest possible life. By way of example, a cell voltage sensing unit is thus used.

FIG. 2 shows the known use of such a cell voltage sensing unit.

FIG. 2 shows an architecture which is known from the prior art for typical cell voltage sensing. In this case, each module 24 with its battery cells 10 has an associated cell voltage sensing unit 26. The cell voltage sensing unit 26 comprises a multiplexer 28 which senses the voltage of each of the individual battery cells 10 by using a number of channels 30 which corresponds to the number of battery cells 10. The multiplexer 28 is connected to a gateway 34 via an analog-to-digital converter 32, said gateway being coupled to a communication bus 36. The communication bus 36 has a central controller, for example a microcontroller 38, connected to it. This microcontroller 38 can therefore be used to sense and evaluate the voltages of the individual battery cells 10. The microcontroller 38 may be part of a battery management unit.

As clarified by FIG. 2, a plurality of modules 24 having battery cells 10 may be arranged in series in this case, said modules each having a dedicated cell voltage sensing unit 26.

The multiplexer 28 may also have auxiliary inputs 40, which are known to be able to be used for temperature measurement, for example by virtue of resistance values of what are known as negative temperature coefficient resistors (also NTC resistors) being sensed.

A drawback of the architecture shown is that the central controller 38 merely communicates with the topmost cell voltage sensing unit 26 directly and each cell voltage sensing unit 26 communicates with the one below it in each case. So that all cell voltages can be transmitted to the central controller 38, they need to be passed through all of the cell voltage sensing units 26 which are situated further above. If at least one of the cell voltage sensing units 26 fails, the cell voltages from all of the cell voltage sensing units 26 below it can no longer be sensed by the central controller 38. If, in the extreme case, the topmost cell voltage sensing unit 26 fails, it is not possible for a single cell voltage in the battery system to be sensed.

SUMMARY

The disclosure provides a battery system having at least two modules which each comprise a multiplicity of battery cells, wherein each module has an associated cell voltage sensing unit, and each of the cell voltage sensing units is designed to sense the voltage of the individual battery cells of the associated module, and wherein the cell voltage sensing units are connected in series by means of a common communication bus and are connected to a central controller, wherein each module additionally comprises a module voltage sensing unit which is designed to sense the voltage of the associated module separately.

This advantageously allows the cell voltages measured by means of the cell voltage sensing unit to be verified by virtue of the voltages of the individual modules additionally being separately measured and (separately) transmitted to the central controller. The central controller is therefore rendered able to compare the cell voltages ascertained by means of the cell voltage sensing units and transmitted via the communication bus in digitized form with the additional information which is provided by means of the module voltage sensing units. In particular, it is thus possible to establish and assess plausibility for the cell voltage information delivered by means of the cell voltage sensing units. If the chain of cell voltage sensing units now fails totally or in part, the battery system can advantageously continue to be operated for a certain time in an emergency mode, which will be described in more detail.

In one preferred embodiment of the disclosure, the module voltage sensing units are formed by module measuring lines, wherein in each case a first module measuring line is connected to a positive pole of the associated module and a second module measuring line is connected to a negative pole of the associated module and said module measuring lines are routed to the central controller. These module measuring lines allow separate measurement of the module voltages irrespective of the standby condition of the cell voltage sensing units and the common communication bus. This embodiment makes it a particularly simple matter to sense the respective module voltages and to make them available to the central controller following conditioning.

The battery cells are preferably in the form of lithium ion battery cells. In addition, in one preferred embodiment of the disclosure, each module voltage sensing unit has an analog optocoupler which has its input side connected to the module measuring lines and its output side connected to the central controller. This has the advantage that the module measuring lines on the output side route no further high voltages to the central controller, which contributes to an increase in system safety.

The disclosure also proposes a method for determining battery module voltages of the battery system, wherein each of the cell voltage sensing units determines the voltages of the individual battery cells and the determined voltage values are transmitted via the common communication bus to the central controller, wherein according to the disclosure additionally a module voltage is sensed separately for each module and supplied to the central controller.

This makes it a simple matter for the information provided by the cell voltage sensing units to be verified using the voltages of the individual battery cells, and in the event of failure of the cell voltage sensing units it is advantageously possible for the battery system to continue to be operated for a certain time in an emergency mode.

To this end, in one preferred variant embodiment of the method, in the event of failure of at least one cell voltage sensing unit, which can be detected by comparing the voltage values transmitted by the common communication bus with prescribed reference voltage values, the current level provided by the battery system is measured and, on the basis of the (preferably most recently) known state of the individual battery cells (preferably immediately before the failure), the charge state and the voltage of the individual battery cells are respectively estimated using the measured current.

In other words, an estimate of the progression of (charge state and hence) the cell voltages of the individual battery cells over time is made from the most recently known state of the individual battery cells and from the current measured at this time and also from the subsequently continuously measured current of the battery system.

However, this estimate alone would not suffice to meet the great demands on reliability, and therefore without further information verifying the estimate the battery system would have to be immediately disconnected. However, since the voltages of the individual modules can be calculated from the estimated voltage values of the individual battery cells and can be compared with the module voltages that are sensed separately according to the disclosure, it is possible, even in the event of failure of at least one cell voltage sensing unit, for a statement about the individual battery cells to be made with increased reliability, since the separately sensed module voltages are an additional piece of information. Finally, provision is made for calculation of the difference in the estimated voltage values of the modules with the separately sensed module voltages and for comparison of the absolute value of this difference with a prescribed tolerance value. If the prescribed tolerance value is undershot, emergency operation is possible, even if there are no voltage values available from the individual battery cells, but rather only voltage values from the modules.

Preferably, the cited method steps are repeated continually in the event of failure of at least one cell voltage sensing unit in order to prevent failure of the whole system.

If the prescribed tolerance value is reached or exceeded, the battery system is disconnected according to the disclosure, since the demands on reliability can no longer be safely met.

A further aspect of the disclosure relates to a motor vehicle which comprises the battery system.

Overall, the effect which can be achieved by the battery system and by the method is that the reliability of the battery system can be checked and any malfunctions can be recognized in good time in order to avoid consequential damage as a result of battery systems operating unreliably.

In addition, even in the event of failure of at least one cell voltage sensing unit, it is possible for the battery system to continue to operate for a certain time.

BRIEF DESCRIPTION OF THE DRAWINGS

Exemplary embodiments of the disclosure are explained in more detail with reference to the drawings and the description below.

In the drawings.

DETAILED DESCRIPTION

Figure 1:
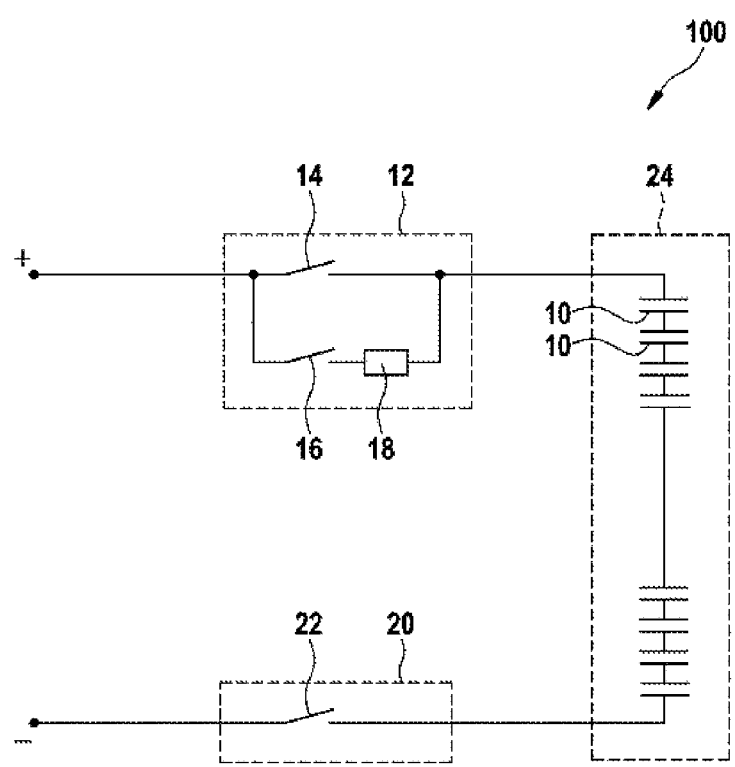
FIG. 1 shows a battery system based on the prior art.
Figure 2:
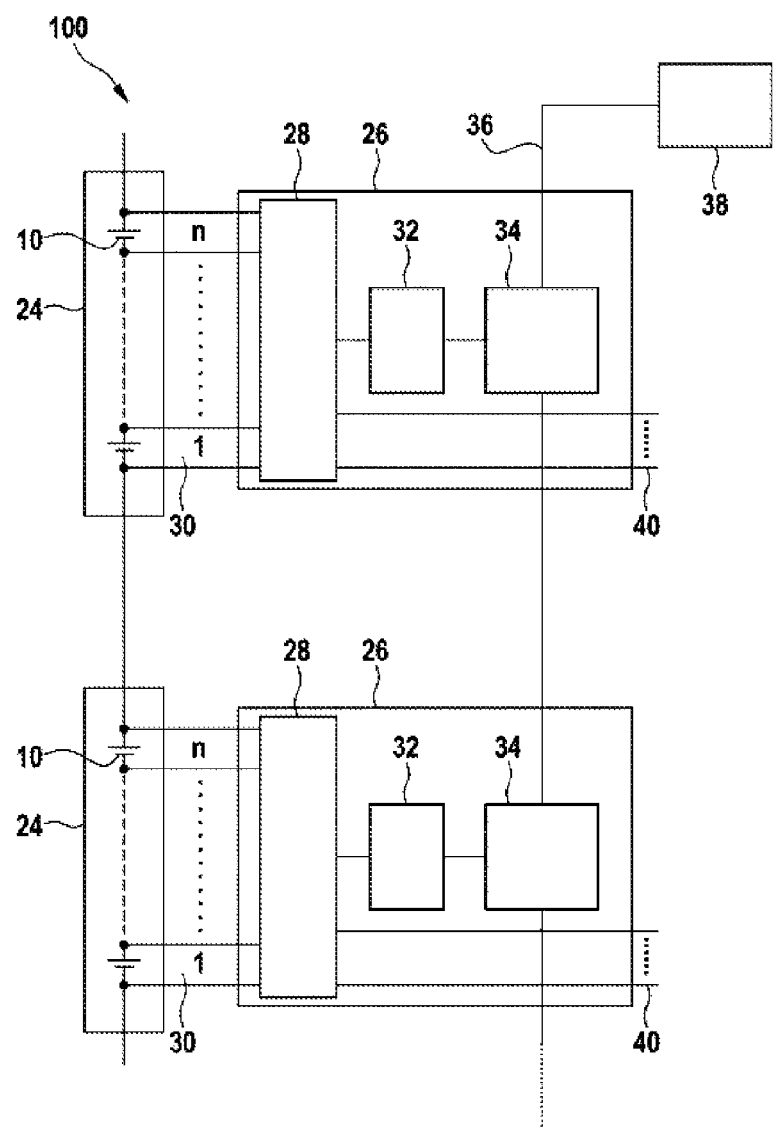
FIG. 2 shows an architecture of a cell voltage sensing unit based on the prior art.
Figure 3:
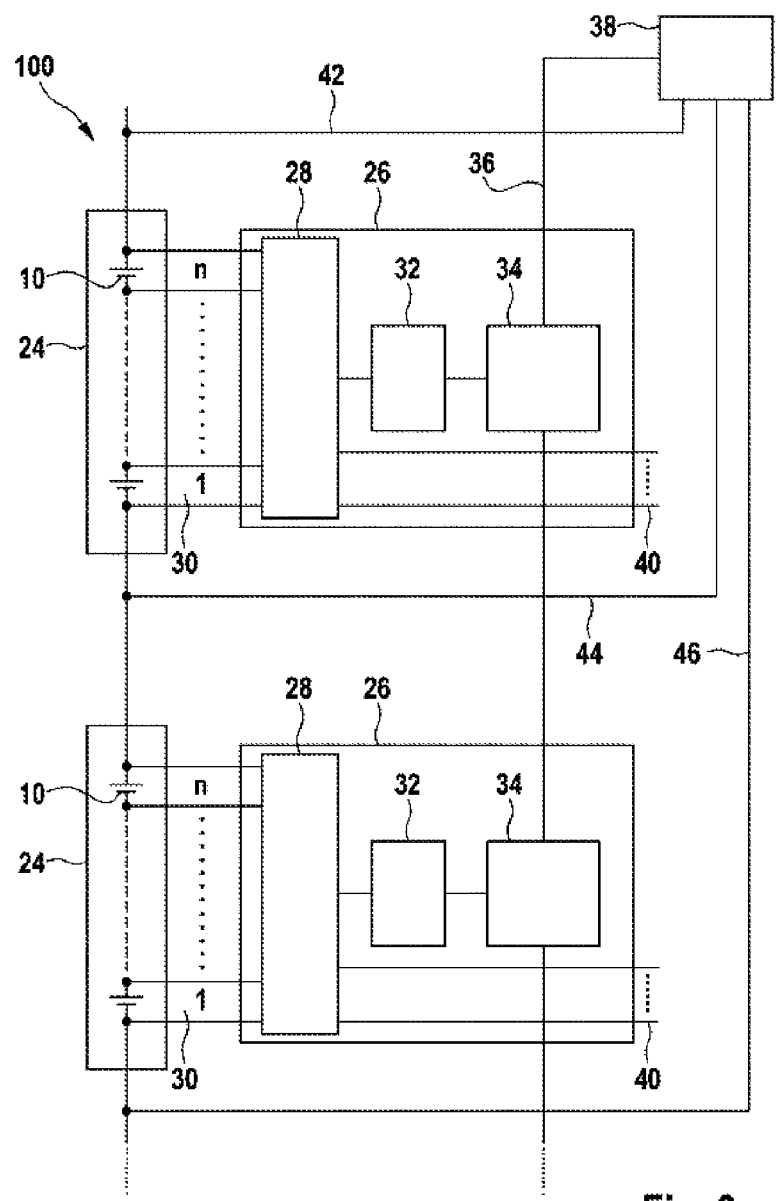
FIG. 3 shows a battery system as disclosed herein with additional battery module voltage measurement based on a first, preferred variant embodiment.

FIG. 3 shows a battery system 100 based on a first preferred variant embodiment of the disclosure. A multiplicity of battery cells 10 are connected in series and combined into modules 24 in each case. A multiplexer 28 combines the cell voltages of the individual battery cells 10 and supplies them to a common communication bus 36 via an analog-to-digital converter 32 and a gateway 34. The microcontroller 38 is used for the voltage evaluation in a manner which is known per se.

FIG. 3 shows two modules 24 by way of example which each have a multiplicity of battery cells 10. On the basis of further exemplary embodiments, not shown, a plurality of the modules 24 may also be connected up in series or else additionally in parallel with one another.

Each module 24 has associated module measuring lines 42, 44, 46. The module measuring lines 42, 44, 46 tap off the voltage which is present across the respective module 24 and route it to the central controller, in the present exemplary embodiment the microcontroller 38.

The central controller 38 therefore simultaneously receives both the information about the voltages of the individual battery cells 10 (and hence also, as a sum of these individual battery cell voltages 10, the voltages of the modules 24) from the cell voltage sensing units 26 (via the communication bus 36) and the module voltages tapped off separately via the module measuring lines 42, 44, 46.

Appropriate association and a comparison of the signals which are provided by means of the communication bus 36 and the module measuring lines 42, 44, 46 can be used to perform a comparison and appropriate evaluation. In this case, the respective module voltage is determined from the voltage tapped off across the module measuring lines 42, 44, 46 and is compared with the cell voltages measured by means of the cell voltage sensing units 26.

Figure 4:
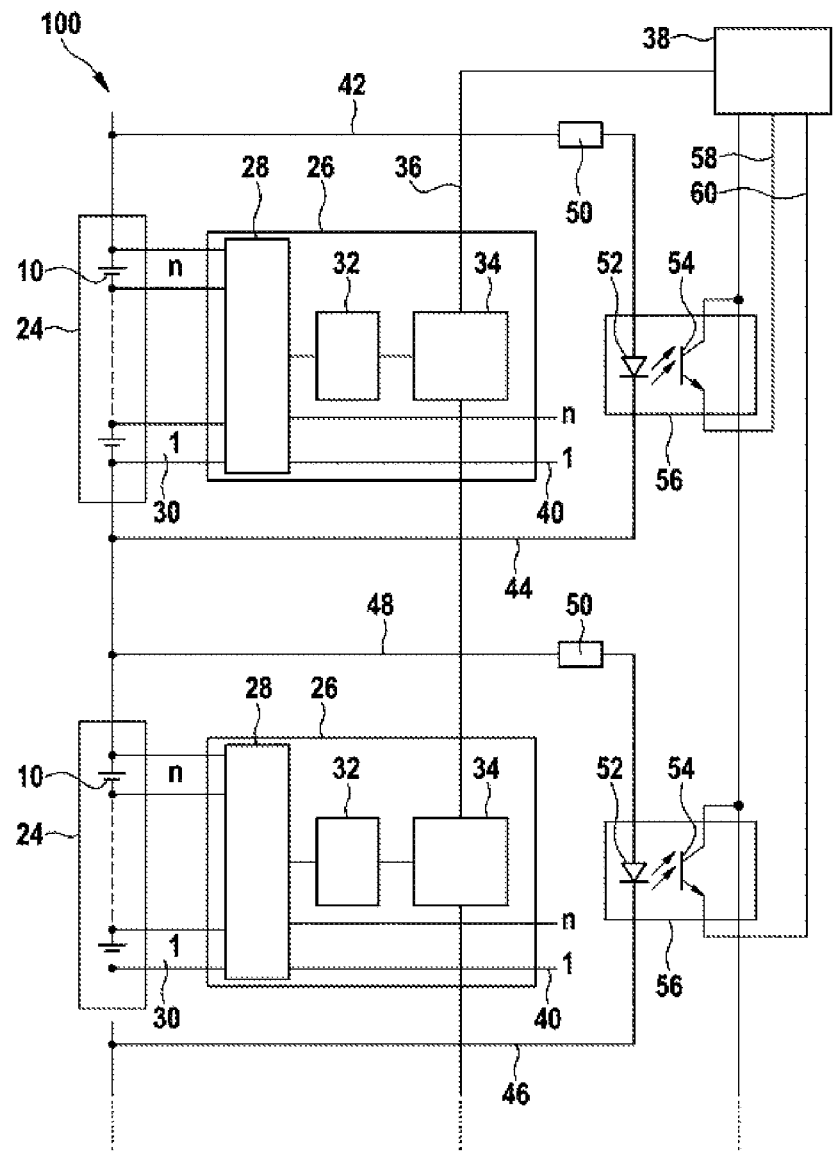
FIG. 4 shows another battery system as disclosed herein with additional battery module voltage measurement based on a second, preferred variant embodiment.

FIG. 4 shows a battery system 100 based on a second preferred variant embodiment of the disclosure. In this case, in each case two separate module measuring lines 42 and 44 or 46 and 48 are provided for each module 24. In addition, the module voltage across an input resistor 50 is converted into a current which corresponds to the module voltage. The optocoupler 56, which is formed by a diode 52 and a transistor 54, then likewise acts on the output side as a current source, the current from which is proportional to the module voltage. This variant embodiment has the advantage that the module measuring lines 58 and 60 on the output side route no further high voltages to the central controller 38, which contributes to increasing the system safety.

Figure 5:
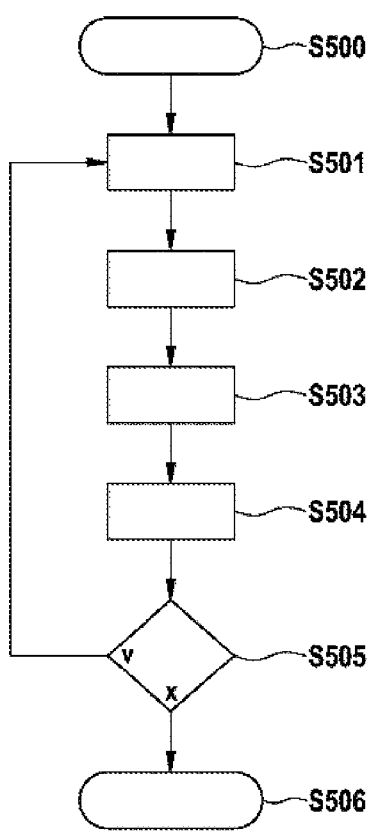
FIG. 5 shows a block diagram for the determination of battery module voltages in the battery system.

FIG. 5 shows a block diagram of the sequence of emergency operation for the battery system which can be performed following detection of failure (method step S500) of at least one cell voltage sensing unit in order to prevent the battery system from being immediately disconnected, in accordance with the disclosure. From the current which is continuously measured anyway for the battery system (method step S501), it is possible to estimate the charge state and the resultant cell voltages on the basis of the most recently known state of the battery cells (method step S502). Such estimation can be performed by mathematical approximation using various algorithms known from the prior art. In other words, a probability is ascertained for the cell voltages of the individual battery cells being in a particular range (on the basis of the known current level of the battery system and the most recently known cell voltages). The sum of the cell voltages respectively associated with a module then provides an estimate of the module voltages (method step S503), which are compared with the module voltages that are measured separately according to the disclosure (method step S504). So long as the difference between the estimate and the measured values is below a prescribed tolerance, operation of the battery system can be maintained (method step S505) and method steps S501 to S505 are repeated. Otherwise, the battery system is disconnected (method step S506).

The invention claimed is:

1. A battery system comprising:
   at least two battery modules connected in series to provide a battery voltage, each of the at least two battery modules comprising:
   a plurality of battery cells connected in series to provide a battery module voltage;
   a cell voltage sensing unit configured to measure a battery cell voltage of each battery cell of the plurality of battery cells; and
   a module voltage sensing unit configured to measure the battery module voltage independently of the cell voltage sensing unit; and
   a central controller, the central controller being operatively connected to the cell voltage sensing unit of each of the at least two battery modules via a common communication bus, the central controller being operatively connected to the module voltage sensing unit of each of the at least two battery modules via separate connections.

2. The battery system as claimed in claim 1, the module voltage sensing units of the at least two battery modules comprising:
   a plurality of module measuring lines routed to the central controller, each module voltage sensing unit having a first module measuring line of the plurality of module measuring lines connected to a positive pole of the respective battery module and a second module measuring line of the plurality of module measuring lines connected to a negative pole of the respective battery module.

3. The battery system as claimed in claim 2, each module voltage sensing unit comprising:

an optocoupler having an input side connected to the plurality of module measuring lines and an output side connected to the central controller.

4. The battery system as claimed in claim 3, the optocoupler comprising:
   an input resistor;
   a diode; and
   a transistor.

5. A method for determining battery module voltages in a battery system including at least two battery modules connected in series to provide a battery voltage, each of the at least two battery modules including (i) a plurality of battery cells connected in series to provide a battery module voltage, (ii) a cell voltage sensing unit configured to measure a battery cell voltage of each battery cell of the plurality of battery cells, and (iii) a module voltage sensing unit configured to measure the battery module voltage independently of the cell voltage sensing unit, the method comprising:
   measuring the battery cell voltages the battery cells of each plurality of battery cells with the respective cell voltage sensing units;
   transmitting the measured battery cell voltages via a common communication bus to a central controller, the central controller being operatively connected to the cell voltage sensing unit of each of the at least two battery modules via the common communication bus;
   measuring the battery module voltages of each battery module with the respective module voltage sensing units; and
   transmitting the measured battery module voltages to the central controller, the central controller being operatively connected to the module voltage sensing unit of each of the at least two battery modules via separate connections.

6. The method as claimed in claim 5, further comprising:
   detecting a failure of at least one of the cell voltage sensing units by comparing the transmitted battery cell voltages with reference voltage values with the central controller;
   measuring a current delivered at present by the battery system with the central controller;
   determining the battery cell voltages of the battery cells from the measured current with the central controller;
   calculating the battery module voltages of the battery modules from the determined battery cell voltages of the battery cells with the central controller;
   determining a difference in the determined battery module voltages of the battery modules with the transmitted battery module voltages with the central controller;
   comparing an absolute value of the determined difference with a prescribed tolerance value with the central controller; and
   disconnecting the battery system if the absolute value of the determined difference exceeds the prescribed tolerance value with the central controller.

7. The method as claimed in claim 6, wherein the steps of measuring the current, determining the battery cell voltages, calculating the battery module voltages, determining the difference, and comparing the absolute value of the determined difference are each continuously repeated at a rate of repetition.

8. The method as claimed in claim 7, wherein the rate of repetition is greater than 0.1 Hz.

9. The method as claimed in claim 7, wherein the rate of repetition is greater than 10 Hz.

10. A motor vehicle comprising:
a drive system; and
a battery system connected to the drive system, the battery system comprising:
- at least two battery modules connected in series to provide a battery voltage, each of the at least two battery modules comprising:
  - a plurality of battery cells connected in series to provide a battery module voltage;
  - a cell voltage sensing unit configured to measure a battery cell voltage of each battery cell of the plurality of battery cells; and
  - a module voltage sensing unit configured to measure the battery module voltage independently of the cell voltage sensing unit; and
- a central controller, the central controller being operatively connected to the cell voltage sensing unit of each of the at least two battery modules via a common communication bus, the central controller being operatively connected to the module voltage sensing unit of each of the at least two battery modules via separate connections.

* * * * *